United States Patent
Greiser

(10) Patent No.: US 7,083,447 B2
(45) Date of Patent: Aug. 1, 2006

(54) PRINTED CIRCUIT BOARD MODULE AND DISCONNECT BOW

(75) Inventor: Frank Greiser, Rheda-Weidenbruck (DE)

(73) Assignee: dspace digital signal processing and control engineering GmbH, Paderborn (DE)

( * ) Notice: Subject to any disclaimer, the term of this patent is extended or adjusted under 35 U.S.C. 154(b) by 0 days.

(21) Appl. No.: 11/058,986

(22) Filed: Feb. 16, 2005

(65) Prior Publication Data

US 2005/0181662 A1    Aug. 18, 2005

(30) Foreign Application Priority Data

Feb. 16, 2004    (DE) ...................... 10 2004 007 740

(51) Int. Cl.
H01R 13/62    (2006.01)

(52) U.S. Cl. .................. 439/160; 439/152; 439/341

(58) Field of Classification Search ................ 439/152, 439/153, 155, 160, 923, 341, 372; 361/754
See application file for complete search history.

(56) References Cited

U.S. PATENT DOCUMENTS

| | | | | |
|---|---|---|---|---|
| 4,867,695 A * | 9/1989 | Speraw | ................ | 439/152 |
| 5,309,325 A | 5/1994 | Dreher et al. | ................ | 361/754 |
| 5,470,240 A | 11/1995 | Suzuki | ................ | 439/157 |
| 5,502,622 A | 3/1996 | Cromwell | ................ | 361/801 |
| 5,504,656 A | 4/1996 | Joist | ................ | 361/754 |
| 5,575,163 A | 11/1996 | Kohl et al. | ................ | 70/58 |
| 5,587,888 A | 12/1996 | Joist | ................ | 361/802 |
| 5,675,475 A | 10/1997 | Mazura et al. | ................ | 361/798 |
| 5,793,614 A | 8/1998 | Tollbom | ................ | 361/732 |
| 5,906,497 A | 5/1999 | Pham et al. | ................ | 439/180 |
| 5,997,326 A | 12/1999 | Koradia et al. | ................ | 439/160 |
| 6,003,689 A | 12/1999 | Babineau et al. | ................ | 211/41.17 |
| 6,030,239 A | 2/2000 | Liu | ................ | 439/160 |
| 6,036,511 A | 3/2000 | Hashimoto | ................ | 439/159 |
| 6,083,019 A | 7/2000 | Yu et al. | ................ | 439/159 |
| 6,146,165 A | 11/2000 | Reich et al. | ................ | 439/159 |
| 6,148,506 A | 11/2000 | Vermette | ................ | 29/758 |
| 6,160,717 A | 12/2000 | Desousa et al. | ................ | 361/798 |
| 6,224,405 B1 * | 5/2001 | Eland | ................ | 439/160 |
| 6,259,607 B1 | 7/2001 | Chien | ................ | 361/754 |
| 6,287,134 B1 | 9/2001 | Liao | ................ | 439/160 |
| 6,288,911 B1 | 9/2001 | Aoki et al. | ................ | 361/801 |
| 6,304,439 B1 | 10/2001 | Anderson | ................ | 361/685 |
| 6,317,967 B1 | 11/2001 | Sampson | ................ | 29/729 |
| 6,354,858 B1 | 3/2002 | Cooper et al. | ................ | 439/327 |
| 6,381,146 B1 | 4/2002 | Sevier | ................ | 361/754 |

(Continued)

FOREIGN PATENT DOCUMENTS

DE    2047134    3/1972

(Continued)

*Primary Examiner*—Tho D. Ta
(74) *Attorney, Agent, or Firm*—Joseph A. Calvaruso; Chadbourne & Parke LLP

(57) ABSTRACT

The invention relates to a printed circuit board module which may be connected by way of at least one plug-in connector with an underlying pcb base and is detachable from the base, whereby to disengage the plug-in connector provision is made for a U-shaped disconnect bow whose two shanks are movably hinged at a distance from the shank ends onto two counteropposed sides of the pcb module. The invention further relates to a disconnect bow mounted on a printed circuit board in order to detach the same from a plug-in connector, whereby the disconnect bow is U-shaped and its two shanks may be movably secured at a distance from the shank ends on two counteropposed sides of the printed circuit board.

7 Claims, 3 Drawing Sheets

U.S. PATENT DOCUMENTS

Figure 1:
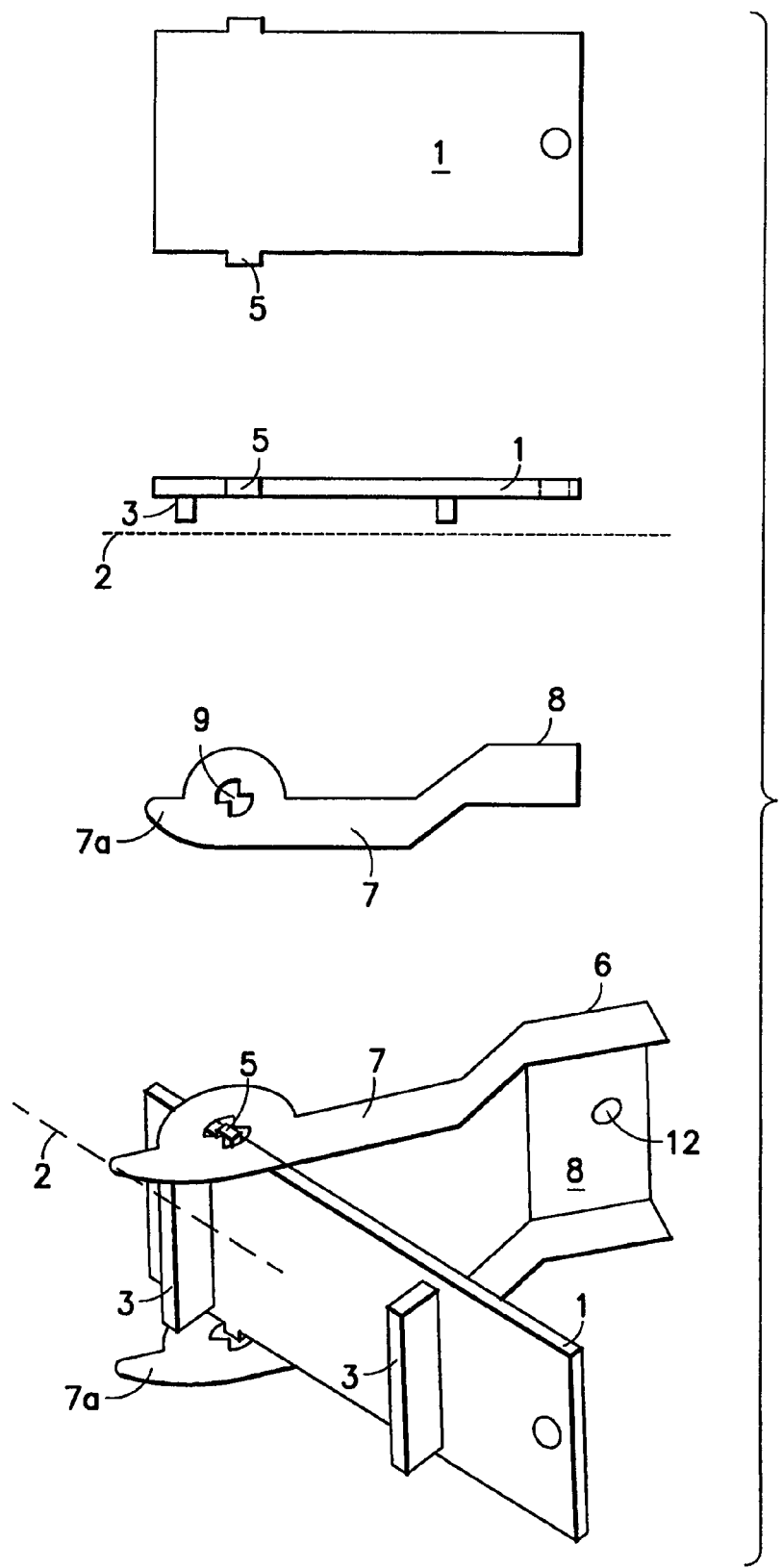

| | | | |
|---|---|---|---|
| 6,396,703 B1 | 5/2002 | White | 361/754 |
| 6,406,309 B1 * | 6/2002 | Ennis et al. | 439/152 |
| 6,424,524 B1 | 7/2002 | Bovio et al. | 361/686 |
| 6,500,023 B1 | 12/2002 | Duong et al. | 439/484 |
| 6,538,972 B1 | 3/2003 | Poulsen | 720/638 |
| 6,702,599 B1 | 3/2004 | Hu et al. | 439/159 |
| 6,754,074 B1 | 6/2004 | McClelland, II et al. | 361/690 |
| 6,796,817 B1 | 9/2004 | Wrycraft | 439/160 |
| 2003/0161118 A1 | 8/2003 | Bovell | 361/759 |
| 2003/0172523 A1 | 9/2003 | Joist et al | 29/758 |

FOREIGN PATENT DOCUMENTS

| | | |
|---|---|---|
| DE | 3620811 | 5/1987 |
| DE | 4020750 | 1/1992 |
| DE | 9114294 | 1/1992 |
| DE | 4105948 | 8/1992 |
| DE | 4213953 | 11/1993 |
| DE | 4307136 | 9/1994 |
| DE | 4336786 | 12/1994 |
| DE | 4428529 | 8/1995 |
| DE | 19507712 | 1/1996 |
| DE | 19601808 | 5/1996 |
| DE | 29605834 | 6/1996 |
| DE | 29621256 | 4/1998 |
| DE | 20201865 | 5/2002 |
| DE | 10231939 | 2/2003 |
| DE | 20311072 | 9/2003 |
| EP | 0317464 | 5/1989 |
| EP | 608938 | 7/1994 |
| EP | 660653 | 6/1995 |
| EP | 780932 | 6/1997 |
| EP | 965713 | 12/1999 |
| EP | 1094584 | 4/2001 |
| EP | 1113714 | 7/2001 |
| EP | 1168523 | 1/2002 |
| EP | 1176858 | 1/2002 |
| EP | 1282199 | 2/2003 |
| EP | 1335644 | 8/2003 |
| EP | 1463394 | 9/2004 |
| JP | 08051288 | 2/1996 |
| WO | WO91/13534 | 9/1991 |
| WO | WO9621258 | 7/1996 |
| WO | WO9854795 | 12/1998 |
| WO | WO2003075624 | 9/2003 |
| WO | WO2003092348 | 11/2003 |

* cited by examiner

PRINTED CIRCUIT BOARD MODULE AND DISCONNECT BOW

The invention relates to a printed circuit board [pcb] module which may be connected by way of at least one plug-in connector with a pcb base mounted thereunder and is detachable from such base. The invention furthermore relates to a disconnect bow which may be mounted on a printed circuit board, especially a pcb module, in order to disconnect same from a plug-in connector.

Printed circuit board modules are known for example to connect electronic modules to a pcb base, wherefore provision is customarily made for a plug-in connector on the side of the pcb module facing the pcb base. To this end the pcb module may carry a plug board and the pcb base a female connector or vice-versa.

In the development of electronic devices, it happens time and again that different pcb modules need to be connected to a pcb base, or that in the framework of development they need to be again and again exchanged. To this end, pcb modules feature appropriate plug-in connectors which the responsible operator often needs to disconnect from the base manually. This is on the one hand expensive and unsafe, since in the presence of excessive operating forces, the electronic contacts may sustain damage. Beyond that, the frequent need for a quick exchange is difficult to realize.

The task of the invention is to create a possibility whereby pcb modules may be quickly and safely detached from a base board, so as to allow other pcb modules to be plugged in on the base.

According to the invention, this task is solved by a pcb module in which for the purpose of disconnecting the plug-in connector, provision is made for a U-shaped disconnect bow whose two shanks are movably hinged a distance away from the shank ends on two counter-opposed sides of the pcb module. The task is furthermore solved by a disconnect bow, which is constructed as previously said and which may be even later mounted on a pcb module.

Such a disconnect bow may be mounted on a pcb module, in order to serve as a lever element to leverage the pcb module out of the plug-in connector with the pcb base. To this end, the span connecting the two shanks of the disconnect bow may preferably serve as a grip by which to move the connector bow as against the pcb module about the pivoting spots. To this end, the grip for example may be seized by a technician from the upper side of a pcb module and moved away from the module.

According to the invention, provision is made with particular preference for the end portions of the disconnect bow shanks, extending from the pivoting sites facing away from the grip, to rest on the pcb base when the grip is moved away from the pcb module onto the pcb base, whereby the pcb module is disengaged from the plug-in connector.

To this end, the structure is preferably chosen in such a way that the length of one of the shanks from the pivoting site to the end facing away from the grip is longer than the distance from the pcb module to the pcb base. This accomplishes that when the grip of the disconnect bow is moved upward, the ends of the shanks facing away from the grip move downward onto the pcb base and ultimately impact the pcb base, so that a continuing motion of the grip generates a resultant force, leveraging the pcb module out of the plug-in connector.

To this end, provision could preferably be made for the end portions of the shank to be rounded in shape, in particular to prevent that in disengaging the plug-in connector damage be caused to the pcb base by reason of these end portions impacting the pcb base.

An articulated connection between the disconnect bow and the pcb module may for example be achieved in a simple embodiment, whereby the pivoting sites on the pcb module are fashioned as lateral protrusions upon which the shanks of the disconnect bow with a recess provided therein may be mounted. As an example, these lateral protrusions may be made of the same material as the printed circuit board and may therefore be formed directly during the production of a printed circuit board.

A disconnect bow is especially easy to mount on these projecting lateral protrusions, in that the shanks linked by the grip may pivot elastically away from each other, so as to augment the distance of the shanks in order to fit them onto the protrusions.

To this end the shanks of the disconnect bow preferably feature borings of an inside diameter larger than the width of the protrusions on the pcb module.

Provision may be made for the protrusions to feature a thickness matching the gauge of the pcb module, but a width greater than the gauge of the module. Accordingly, inside the recesses designed to accommodate the protrusions in the shanks, provision may be made for inward facing bulges to limit the range of motion of the disconnect bow at the pivoting sites An especially preferred provision may be made for the pivoting sites to be arranged in the area of a plug-in connector. This has the special advantage that no more than modest shearing forces are exerted on the plug-in connector in disengaging the pcb module.

In order to further limit the shearing forces, provision may be made for a support to be mounted on the pcb module on the side facing the pcb base, against which the pcb module rests in disengaging from the pcb base. This support may also be preferably mounted in the area of a plug-in connector, whereby in a further enhancement, provision may be made that in an arrangement of two plug-in connectors on the pcb module, one support may be mounted in the area of one plug-in connector and the pivoting site of the disconnect bow in the area of the other plug-in connector.

Provision may similarly be made for a supporting element to be arranged beneath the pcb module on the pcb base, on which the module will rest in disengagement. The aforesaid supporting element may preferentially be designed as a heat sink.

For further optimization, the position and height of the supporting element may be so chosen that in detaching a pcb module, especially one that features several spatially divided plug-in connectors, a minimal angular deflection occurs within the plug-in (connector/socket) connection. This may additionally be affected by means of the structural design of the disconnect bow and the location of the plug-in connectors on the module carrier. In a further embodiment, the disconnect bow may be fixed in relation to the pcb module, so as to exclude inadvertent operation and disengagement of the module. To this end, for example, the disconnect bow may feature a boring in the grip element, whereby the disconnect bow and the module and/or the pcb base may be secured, especially with the aid of a screw.

Figure 2:
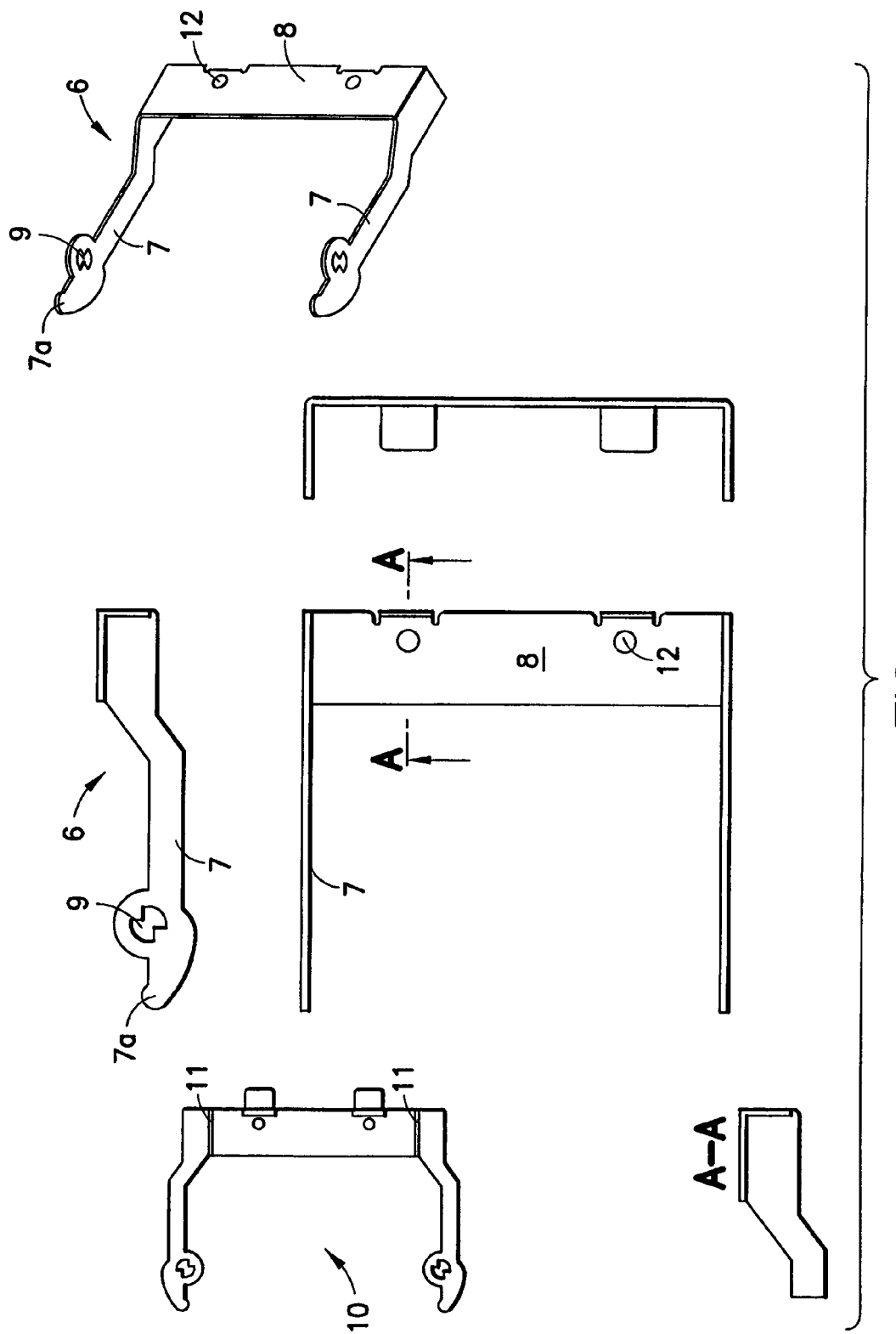
Figure 3:
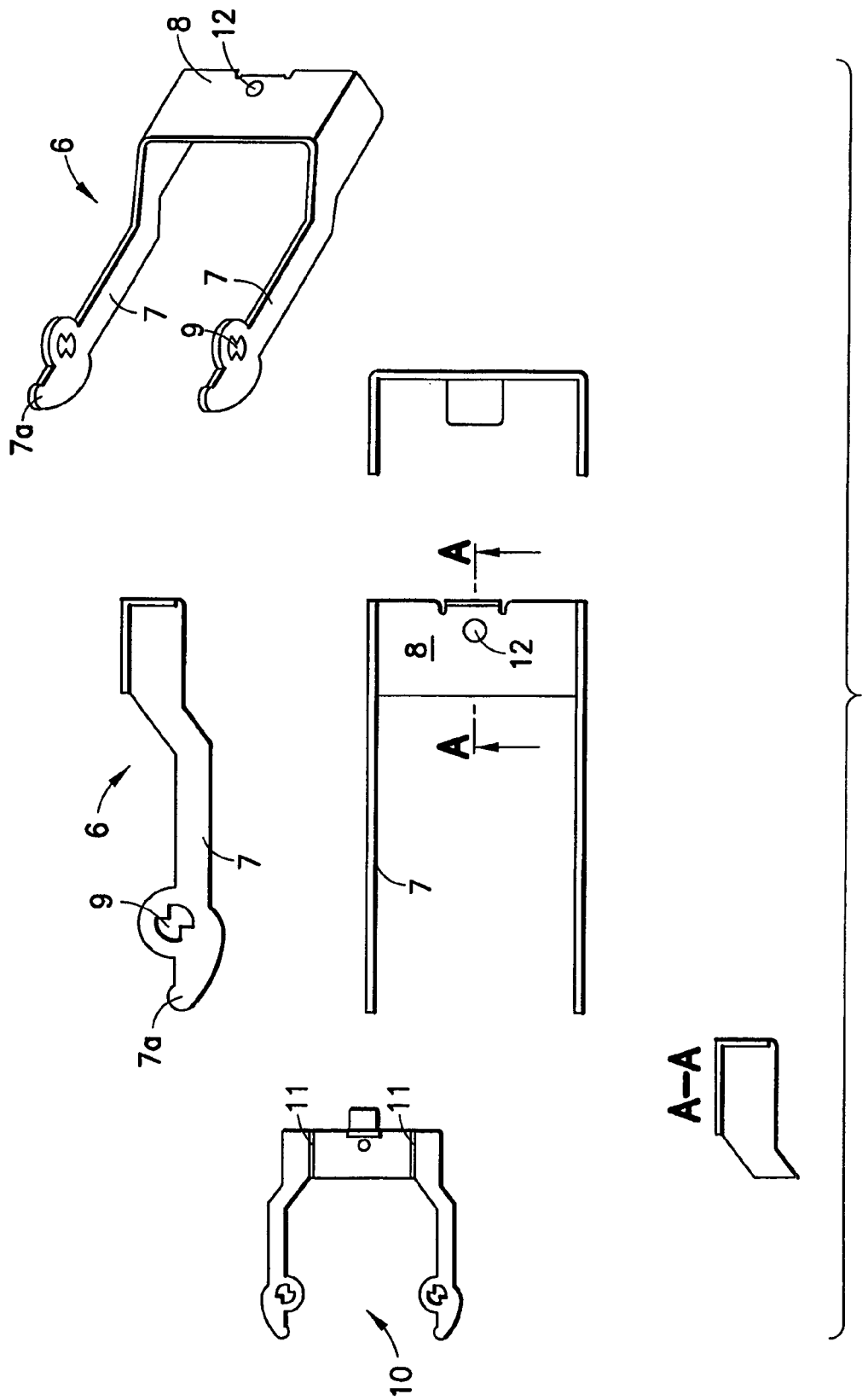

The following illustrations show examples of embodiment according to the invention. Shown are:

FIG. 1: a pcb module with disconnect bow;

FIG. 2: a disconnect bow;

FIG. 3: a disconnect bow as in FIG. 1, but of lesser width.

FIG. 1 shows in single representation and in assembled state a pcb module 1, shown above a pcb base 2, not illustrated but merely dotted, whereby the plug-in connector is shown detached. A female connector 3 may be seen below the pcb module 1. Such female connector 3 may be mounted upon a plug board, not illustrated, on the pcb base 2.

In the area of the female connector 3 it will be seen that on pcb module 1 on the two counteropposed long sides, there are projecting board areas 5, designed for rotational accommodation of a disconnect bow 6 according to the invention. Such a disconnect bow 6 is shown in lateral and perspective view in FIGS. 2 and 3 in different sizes and/or widths. FIG. 2 shows that a disconnect bow 6 according to the invention features a substantially U-shaped form, whereby the two shanks 7 of a disconnect bow 6 are interlinked by a joining grip element 8. In the terminal area of shank 7, but a distance away from the end of shank 7, a pass-through recess 9 is arranged on both its sides, into which projections 5 on the pcb module 1 may be plugged in, thereby creating a rotary connection between the recesses 9 and the projections 5.

It is manifest in this case that a disconnect bow 6 secured to a pcb module 1 may be used to disengage the pcb module 1 safely and quickly from the pcb base 2. To this end, a technician can seize the grip element 8 and rotate the disconnect bow 6 about the pivot point 5/9. As the grip element 8 is raised in relation to the pcb module 1, the ends 7a of the shank 7 automatically move onto the pcb base 2 and settle thereon.

In order to prevent damage in setting down, the ends 7a are rounded. In continued motion of the grip element 8, effective force is exerted, leveraging the pcb module 1 out of the pcb base 2.

It will further be seen in FIG. 2 that the U-shaped disconnect bow may be produced from a single foil, whereby the contours of the disconnect bow 6 may be produced by stamping or laser cutting. The stamped or cut contour 10 can then be bent over on spots 11 in order to produce the disconnect bow 6 according to the invention.

Inasmuch as the two shanks 7 of the disconnect bow 6 may move elastically against each other, there is also the possibility of setting such disconnect bow 6 subsequently upon a pcb module 1 with the appropriate protrusions 5. Similarly, a disconnect bow 6 according to the invention may be disengaged from pcb module 1 after the same has set upon the pcb base 2, in order to prevent the pcb module 1 from being removed from pcb base 2.

FIGS. 2 and 3 farther show that at least one boring 12 is arranged in the grip element 8 of the disconnect bow 6, which may for example serve to secure the disconnect bow 6 onto the pcb module 1 or the pcb base 2 lying thereunder, with the aid of a screw.

Independent of the chosen sample embodiment, the pcb module 1 illustrated herein may be designed as a single layer or multilayered printed circuit board. Such a pcb module 1 may bear passive and/or active electronic components, in particular integrated circuits forming the electronic module to be arranged on a pcb base 2.

Along with the electronic plug-in connectors between the pcb module and base, there may also be optical connections detachable by means of a disconnect bow 6 according to the invention. The special advantage of the disconnect bow 6 according to the invention emerges from the fact that, in particular when the pivoting site 5/9 is arranged in the area of a plug-in connector 3, only minimal shearing forces are exerted thereon.

This application claims priority from German Application No. 10 2004 007 740.1 filed on Feb. 16, 20904 which is hereby incorporated by reference herein.

The invention claimed is:

1. A printed circuit board assembly comprising:
   a printed circuit board releasably attachable to a base, the printed circuit board having a pair of opposed side portions formed from projections of the printed circuit board; and
   a generally U-shaped bow member having a pair of spaced apart shanks and an intermediate portion disposed between the two shanks, each shank having a free end, each free end being pivotally couplable to one of the printed circuit board side portions.

2. A printed circuit board assembly according to claim 1, wherein the free ends of the shanks of the bow member rest upon the base when the intermediate portion of the bow member is moved away from the printed circuit board, whereby the printed circuit board may be disengaged from the base.

3. A printed circuit board assembly according to claim 1, wherein the free ends of the shanks are of rounded shape.

4. A printed circuit board module according to claim 1, wherein the intermediate portion of the bow member comprises a hole, whereby the bow member may be secured to the printed circuit board and/or the base.

5. A printed circuit board assembly according to claim 1, wherein a supporting element is arranged on the printed circuit board on a side facing the base to support the printed circuit board when resting against the base.

6. A printed circuit board assembly according to claim 5, wherein the supporting element is arranged in the area of a plug-in connector.

7. A printed circuit board module according to claim 5, wherein the supporting element is arranged under the printed circuit board on the base, upon which the printed circuit board rests.

* * * * *